US010497785B2

(12) United States Patent
Dasgupta et al.

(10) Patent No.: US 10,497,785 B2
(45) Date of Patent: Dec. 3, 2019

(54) GALLIUM NITRIDE VOLTAGE REGULATOR

(71) Applicant: Intel Corporation, Santa Clara, CA (US)

(72) Inventors: Sansaptak Dasgupta, Hillsboro, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/079,337

(22) PCT Filed: Mar. 28, 2016

(86) PCT No.: PCT/US2016/024424
§ 371 (c)(1),
(2) Date: Aug. 23, 2018

(87) PCT Pub. No.: WO2017/171700
PCT Pub. Date: Oct. 5, 2017

(65) Prior Publication Data
US 2019/0058041 A1    Feb. 21, 2019

(51) Int. Cl.
*H01L 29/20* (2006.01)
*H01L 21/8252* (2006.01)
(Continued)

(52) U.S. Cl.
CPC ...... *H01L 29/2003* (2013.01); *H01L 21/0254* (2013.01); *H01L 21/02458* (2013.01);
(Continued)

(58) Field of Classification Search
CPC ............ H01L 29/2003; H01L 29/205; H01L 29/7787; H01L 29/66462; H01L 21/02458;
(Continued)

(56) References Cited

U.S. PATENT DOCUMENTS

2005/0077541 A1    4/2005  Shen et al.
2010/0140663 A1    6/2010  Hopper et al.
(Continued)

OTHER PUBLICATIONS

International Search Report and Written Opinion issued in PCT Application No. PCT/US2016/024424 dated Dec. 19, 2016; 8 pages.

*Primary Examiner* — Anthony Ho
(74) *Attorney, Agent, or Firm* — Patent Capital Group

(57) ABSTRACT

A gallium nitride transistor can include a silicon substrate and a first oxide layer and a second oxide layer on the substrate. A first gallium nitride layer may reside on the silicon substrate and the first and second oxide layers. A polarization layer may reside on the first gallium nitride layer. A two dimensional electron gas may exist in the first gallium nitride layer proximate to the polarization layer. A second gallium nitride layer may reside on a first sidewall of the polarization layer and on the first oxide layer on the substrate. A first p-doped gallium nitride layer may reside on the second gallium nitride layer. A third gallium nitride layer may reside on a second sidewall of the polarization layer and on the second oxide layer on the substrate. A second p-doped gallium nitride layer may reside on the second gallium nitride layer.

25 Claims, 11 Drawing Sheets

(51) Int. Cl.
*H01L 29/778* (2006.01)
*H01L 27/06* (2006.01)
*H01L 27/092* (2006.01)
*H01L 29/78* (2006.01)
*H01L 21/02* (2006.01)
*H01L 21/8238* (2006.01)
*H01L 29/205* (2006.01)
*H01L 29/66* (2006.01)
*H01L 29/04* (2006.01)
*H01L 29/423* (2006.01)
*H01L 21/84* (2006.01)
*H01L 27/12* (2006.01)
*H01L 29/06* (2006.01)

(52) U.S. Cl.
CPC .... *H01L 21/02516* (2013.01); *H01L 21/8252* (2013.01); *H01L 21/823807* (2013.01); *H01L 21/823821* (2013.01); *H01L 27/0605* (2013.01); *H01L 27/092* (2013.01); *H01L 27/0924* (2013.01); *H01L 29/045* (2013.01); *H01L 29/205* (2013.01); *H01L 29/66462* (2013.01); *H01L 29/7786* (2013.01); *H01L 29/7787* (2013.01); *H01L 29/785* (2013.01); *H01L 21/84* (2013.01); *H01L 21/845* (2013.01); *H01L 27/1203* (2013.01); *H01L 27/1211* (2013.01); *H01L 29/0649* (2013.01); *H01L 29/0657* (2013.01); *H01L 29/42392* (2013.01)

(58) Field of Classification Search
CPC ........... H01L 21/02516; H01L 21/0254; H01L 21/82307; H01L 29/785; H01L 27/092; H01L 27/0605; H01L 29/7786; H01L 21/8252; H01L 29/0649; H01L 27/1211; H01L 27/1203; H01L 21/845; H01L 21/84; H01L 29/0657; H01L 29/42392
See application file for complete search history.

(56) References Cited

U.S. PATENT DOCUMENTS

2011/0204380 A1 8/2011 Yoshioka et al.
2014/0346568 A1 11/2014 Jaeger et al.
2015/0187924 A1 7/2015 Dasgupta et al.

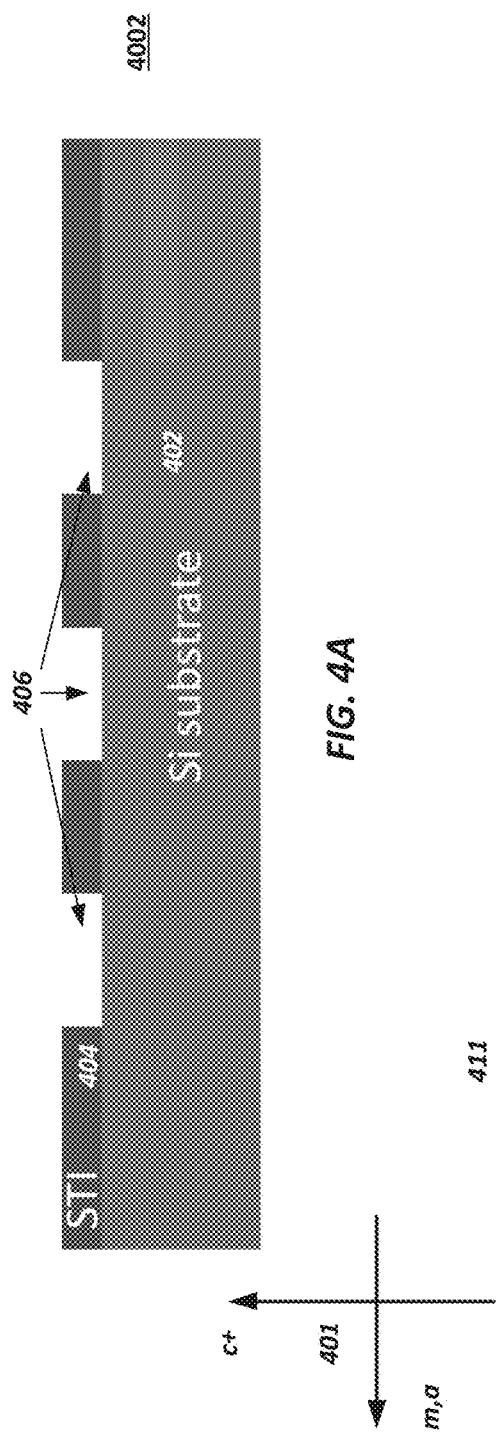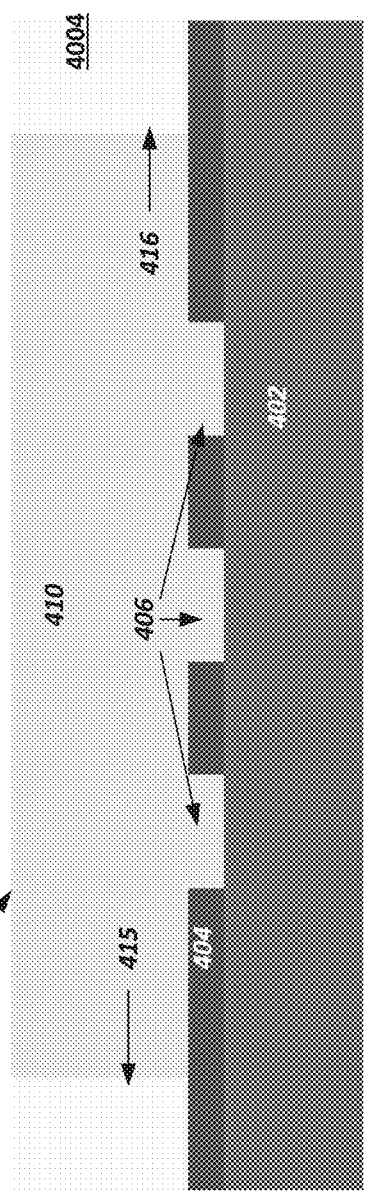
FIG. 4A
FIG. 4B

GALLIUM NITRIDE VOLTAGE REGULATOR

CROSS-REFERENCE TO RELATED APPLICATION

This application is a national stage application under 35 U.S.C. § 371 of PCT International Application Serial No. PCT/US2016/024424, filed on Mar. 28, 2016 and entitled "GALLIUM NITRIDE VOLTAGE REGULATOR," which is hereby incorporated by reference in its entirety.

TECHNICAL FIELD

This disclosure pertains to gallium nitride (GaN) voltage regulators, and more particularly, to co-integrating GaN p-type metal oxide semiconductor (PMOS) and n-type metal oxide semiconductor (NMOS) for voltage regulators and radio frequency power amplifiers.

BACKGROUND

Voltage regulators can convert high voltage to smaller voltages for use in electronic devices, such as those used in computing systems. Silicon (Si)-based voltage regulators can suffer from increasing inefficiencies at higher voltages.

BRIEF DESCRIPTION OF THE DRAWINGS

FIG. 4A-4E are schematic block diagrams for forming a gallium nitride based complementary metal oxide semiconductor (CMOS) transistor in accordance with embodiments of the present disclosure.

DETAILED DESCRIPTION

Described herein are systems and methods of co-integrating gallium nitride (GaN) p-type metal oxide semiconductor (PMOS) transistor with n-type MOS (NMOS) transistors, which can be used for voltage regulation and radio frequency power amplification. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Group III+nitride (III-N) material-based transistors are useful for high voltage and high frequency applications, and hence promising candidates for system-on-chip (SoC) applications such as power management integrated circuits (PMIC) and radio frequency (RF) power amplifiers (PA). For example, gallium nitride (GaN) is a wide bandgap material, which can take in higher voltage in a smaller footprint with lower input resistance.

Cointegration of GaN transistors with silicon can be challenging to the large lattice mismatch of ~41% between them, resulting in high detect densities and due to the mismatch in thermal expansion coefficient between Si and GaN (~116%) resulting in surface cracks on GaN grown on silicon.

This disclosure describes using p and n channel GaN transistors fabricated on silicon that can act as building blocks for GaN transistor circuits, such as controller logic for the integrated voltage regulators. Coplanar p and n channel GaN transistors described herein can also be used in different contexts other than voltage regulation, such as to fabricate logic devices with high breakdown voltages.

Figure 1:
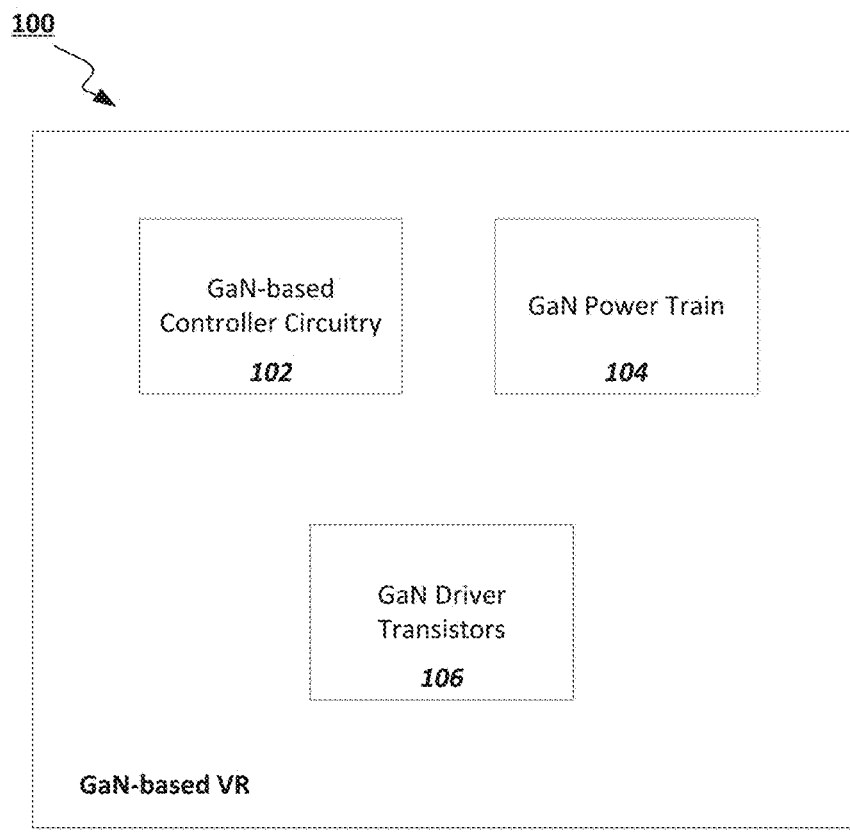
FIG. 1 is a schematic block diagram of a gallium nitride based voltage regulator in accordance with embodiments of the present disclosure.

FIG. 1 is a schematic block diagram of a gallium nitride (GaN)-based voltage regulator (VR) 100. The GaN-based VR 100 can convert high voltage to smaller voltages for use in electronic devices, such as those used in computing systems. The GaN-based VR 100 is formed on a silicon (Si) substrate and use the following building blocks:

A controller circuit 102 provides timing signals for when to switch a transistor. The GaN-based VR 100 can also include a power train circuit 104 that includes high voltage transistors. The GaN-based VR 100 can also include driver transistors 106 that modulate the gate of the power train.

The term GaN-based VR implies that the transistors used in the VR are composed of gallium nitride semiconducting material formed on a silicon wafer, such as a typical 300 mm wafer. The use of a silicon base offers scalability for high volume manufacturing and allows for the use of existing semiconductor processing techniques to be used to form the GaN-based transistors.

Figure 2:
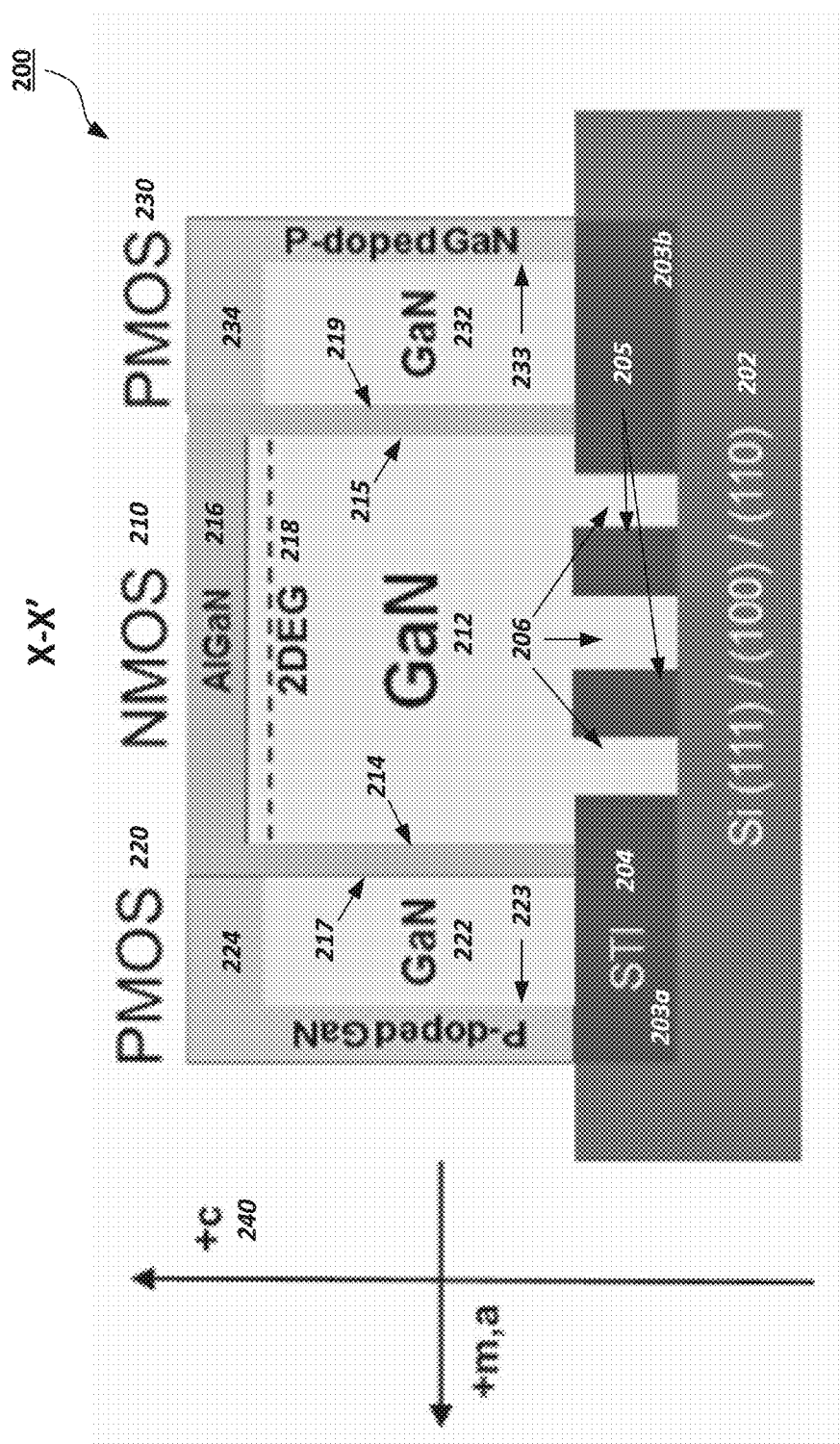
FIG. 2 is a schematic block diagram of a gallium nitride based complementary metal oxide semiconductor (CMOS) transistor in accordance with embodiments of the present disclosure.

FIG. 2 is a schematic block diagram of a gallium nitride based complementary metal oxide semiconductor (CMOS) transistor 200 in accordance with embodiments of the present disclosure. FIG. 2 shows the layer structures used to obtain the n channel next to two p channels. The GaN-based CMOS transistor 200 includes an n-type metal oxide semiconductor (NMOS) transistor 210 and a plurality of p-type MOS (PMOS) transistors—in FIG. 2 shown with two PMOS transistors 220 and 230 on opposite sides of the NMOS transistor 210.

The GaN-based CMOS transistor 200 is formed on a silicon substrate. A silicon (111), (100), or (110) substrate can be used. An area of the silicon can be etched and an oxide layer grown within the etched area. This oxide layer will form the basis of the shallow trench isolation structures 204. The shallow trench isolation structure 204 can be formed by a patterned etching of the oxide layer so as to form trenches 206 separating layers of oxide 205. The shallow trench isolation structure 205 also include oxide layer 203a and 203b.

The GaN-based NMOS transistor 210 resides on a silicon substrate. The GaN layer can be epitaxially grown from the surface of the silicon or from a seed layer on the surface of the silicon). The shallow trench isolation structures 205 promote gallium nitride growth.

The first gallium nitride (GaN) layer 212 is grown in a direction substantially parallel to the c-axis (as shown in the axis 240). A polarization layer 216 resides on a top portion of the first GaN layer 212 and on sidewalls 214 and 215 of the first GaN layer 212. In some embodiments, the polarization layer 216 on the sidewalls 214 and 215 of the first GaN layer can contact a portion of the oxide layer 203a and 203b of the shallow trench isolation structure.

GaN is a Wurtzite crystal and hence has polarization properties. By forming the GaN device in the c-axis configuration as shown in FIG. 2, the discontinuity in polarization of polarization layer 216 with the first GaN layer 212 results in the formation of a two dimensional electron gas (2DEG) 218 at the interface between the first GaN layer 212 and the polarization layer 216. The 2DEG 218 is located at the interface between the GaN layer and the polarization layer 216, and can span 1-3 nm from the interface into the GaN layer, depending on the total channel charge.

The polarization layer 216 can include an aluminum and nitride alloy. For example, the polarization layer 216 can include aluminum nitride (AlN), aluminum gallium nitride (AlGaN), or aluminum indium nitride (AlInN).

The GaN-based CMOS transistor 200 also includes a first p-type MOS (PMOS) transistor 220. The first PMOS transistor 220 includes a second gallium nitride layer 222 formed on a sidewall 217 of the polarization layer 216 and can contact an oxide layer 203a of the shallow trench isolation structure 204. The second GaN layer 222 that forms the PMOS 220 is an undoped GaN layer. A p-doped GaN layer 224 is formed on the second GaN layer 222. The p-doped GaN layer 224 can be doped using magnesium as a dopant. The p-doped GaN layer 224 can serve as the active layer of the PMOS transistor 220.

The GaN-based CMOS transistor 200 also includes a second p-type MOS (PMOS) transistor 230. The second PMOS transistor 230 includes a third gallium nitride layer 232 formed on a sidewall 219 of the polarization layer 216 and can contact an oxide layer 203b of the shallow trench isolation structure 204. The third GaN layer 232 that forms the PMOS 230 is an undoped GaN layer. A p-doped GaN layer 234 is formed on the second GaN layer 232. The p-doped GaN layer 234 can be doped using magnesium as a dopant. The p-doped GaN layer 234 can serve as the active layer of the PMOS transistor 230.

Figure 3:
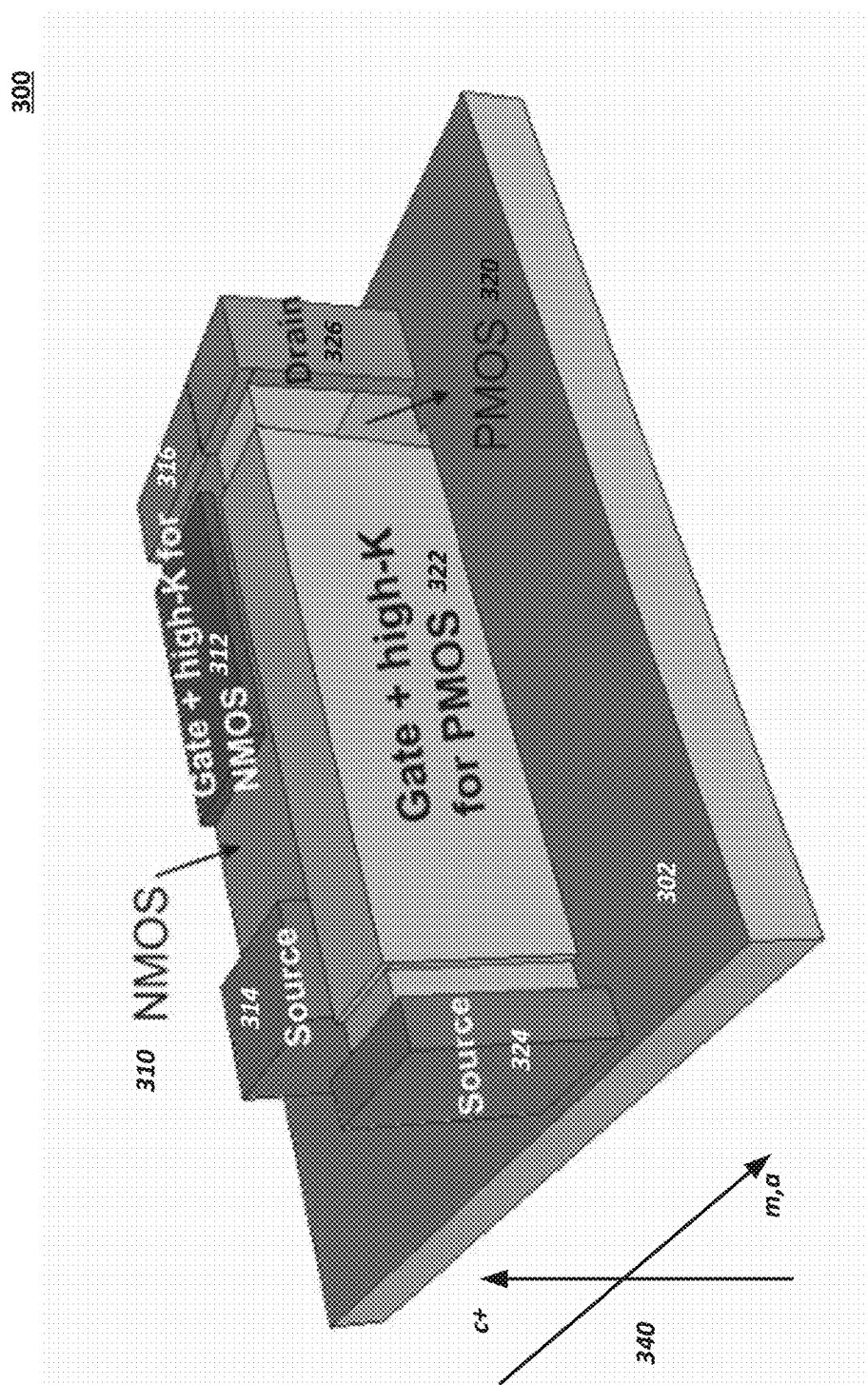
FIG. 3 is an isometric view of a schematic block diagram a gallium nitride based complementary metal oxide semiconductor (CMOS) transistor in accordance with embodiments of the present disclosure.

FIG. 3 is an isometric view of a schematic block diagram a gallium nitride based complementary metal oxide semiconductor (CMOS) transistor 300 in accordance with embodiments of the present disclosure. The GaN-based CMOS transistor 300 includes an GaN-based NMOS transistor 310 and a GaN-based PMOS transistor 320 (and though not shown can also include a second GaN-based PMOS transistor on the other side of the NMOS, opposite the GaN-based PMOS transistor 320 shown). More specifically, the GaN that forms the PMOS 320 is grown in the m direction (based on the axis system 340) from the polarization layer sidewall, as described in the text accompanying FIG. 2.

The isometric view of FIG. 3 shows that the GaN layers that form the NMOS 310 and the PMOS 320 can be grown monolithically on the silicon substrate 302 and the STI underlying the NMOS and PMOS (not shown in FIG. 3). Additionally, FIG. 3 shows the source, drain, and gate for each of the NMOS 310 and PMOS 320.

The NMOS 310 includes a gate over a high-K dielectric 312. The gate over high-K dielectric can be formed on a top side of the first GaN layer (e.g., in a plane perpendicular to the c-axis of the axis system 340). The gate material can include titanium, aluminum, tungsten, or other similar metals. The high-K dielectric material under the gate can include aluminum oxide (Al2O3), silicon oxide (SiO2), silicon nitride (SiN), hafnium oxide (HfO2), or other high-K combinations. Metals for the gate stack between the gate and the high-k dielectric can include nickel, gold, platinum, titanium nitride, etc.

The NMOS 310 can include a source 314 adjacent to a first end of the first gallium nitride layer. A drain 316 can reside adjacent to a second end of the first gallium nitride layer opposite to the first end. The gate material can include titanium, aluminum, tungsten, or other similar metals.

The PMOS 320 can include a gate over a high-K dielectric 322. The PMOS 320 can also include a source 324 and a drain 326. Examples of metals for Ohmic contact to p+ GaN source and drain would be Ni, Au, Pt. Materials used in the gate stack for p channel would be: Dielectrics: Al2O3, HfO2, SiO2, SiN, other hi-k materials and combinations of these elements. Metals for the Ohmic contact for the gate can include titanium, titanium nitride, aluminum, etc.

FIG. 4A-4E are schematic block diagrams for forming a gallium nitride based complementary metal oxide semiconductor (CMOS) transistor in accordance with embodiments of the present disclosure.

FIG. 4A is a schematic block diagram 4002 of a silicon substrate that can be used for forming a gallium nitride based CMOS transistor. The silicon substrate can be a Si 100, 110, or 111 orientation. A shallow trench isolation (STI) layer 404 can be formed on the Si substrate. The STI can be formed by growing an oxide layer on the Si substrate. Trenches 406 can be formed by patterning and etching the oxide to expose portions of the Si substrate.

FIG. 4B is a schematic block diagram 4004 for growing a gallium nitride layer 410 (or block) from the STI trenches 406 for the NMOS transistor. A low defect density GaN 410 is grown out of the trenches in the c-axis direction (from the axis system 401). The GaN can include a top portion 411, a first sidewall 415, and a second sidewall 416.

Figure 4C:
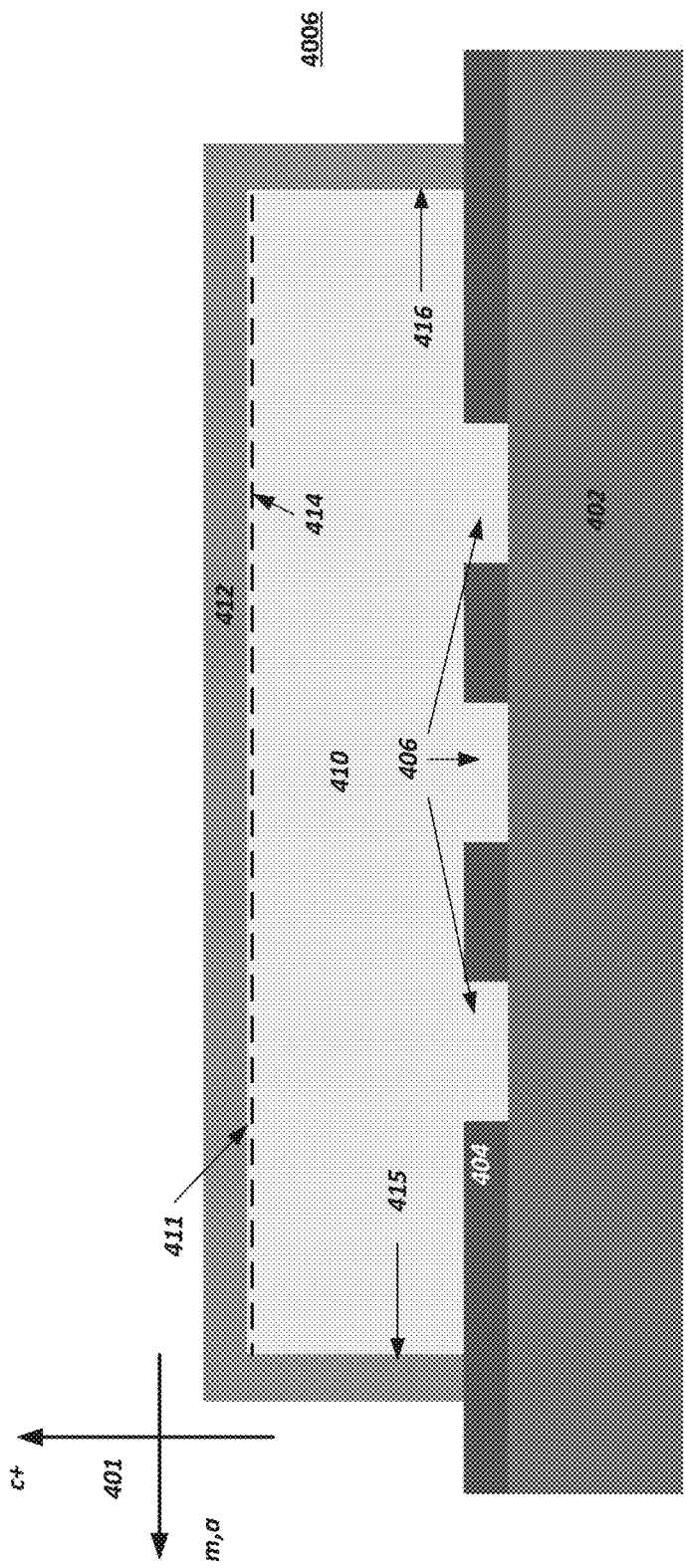

FIG. 4C is a schematic block diagram 4006 for forming a polarization layer 412 for the NMOS transistor. The polarization layer 412 can include AlN, AlGaN, or AlInN. The polarization layer is grown on a top portion 411 of the GaN layer. The polarization layer 412 formed on the top of the GaN layer (which is grown in the c-axis direction) results in the formation of a two dimensional electron gas (2DEG) 414 at the interface between the GaN layer 410 and the polarization layer 412.

Figure 4D:
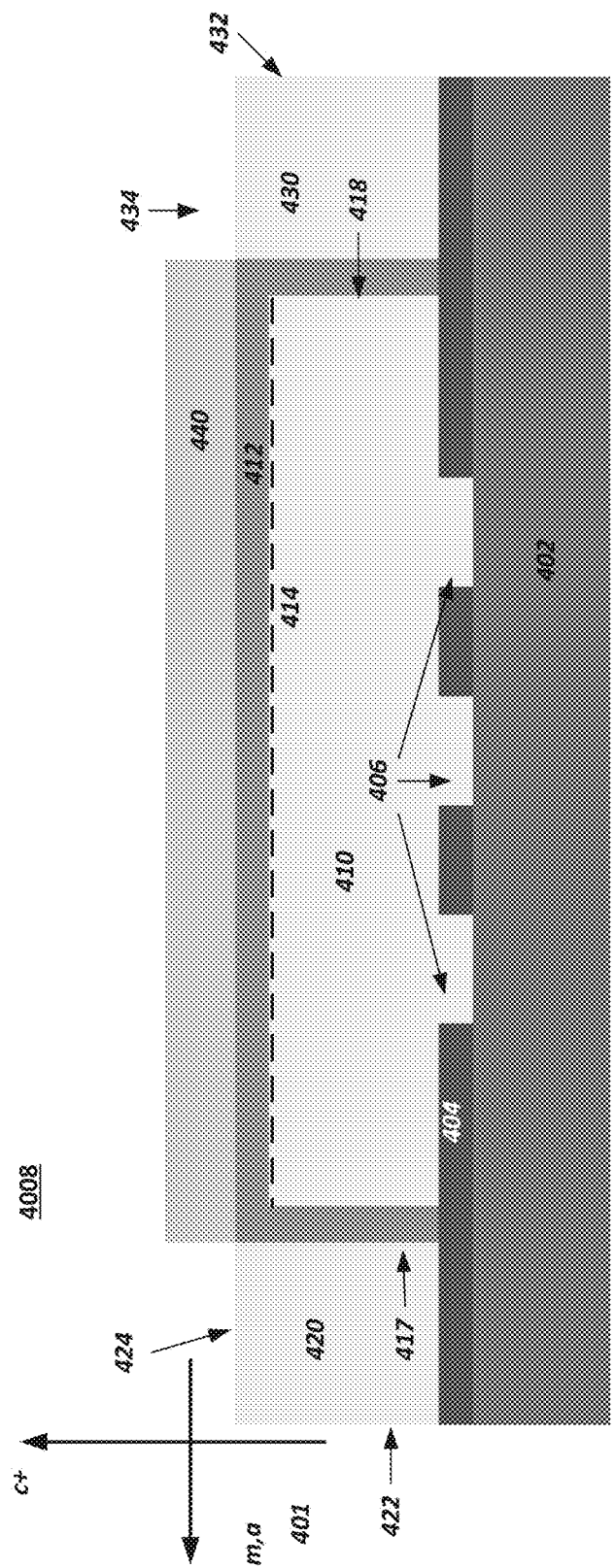

FIG. 4D is a schematic block diagram 4008 for forming p-type MOS transistors adjacent to the NMOS. A hard mask 440, such as SiO2 or SiN can be formed on the polarization layer to protect. A GaN layer 420 is formed on a sidewall 417 of the polarization layer 412. A GaN layer 430 is also formed on a sidewall 418 of the polarization layer 412. The GaN layers 420 and 430 can be grown epitaxially (and at the same time or during the same processing run) from sidewalls of the polarization layer 412 in a m direction (based on the axis system 401). The m-plane is the nonpolar plane, so no polarization effect occurs at the interface between the undoped GaN 420 and the polarization layer sidewall 417.

Likewise, there is no polarization effect occurring at the interface between the undoped GaN 430 and the polarization layer side wall 418. Therefore, the 2DEG 214 is isolated within the NMOS GaN layer 410.

The hard mask 440 prevents further GaN formation on the top side of the polarization layer 412. The hard mask 440 also encourages GaN growth on the polarization layer 412 in an m-axis direction. The GaN layers 420 and 430 are grown to a thickness on the order of 30-50 nm. The GaN layers 420 and 430 are undoped.

Figure 4E:
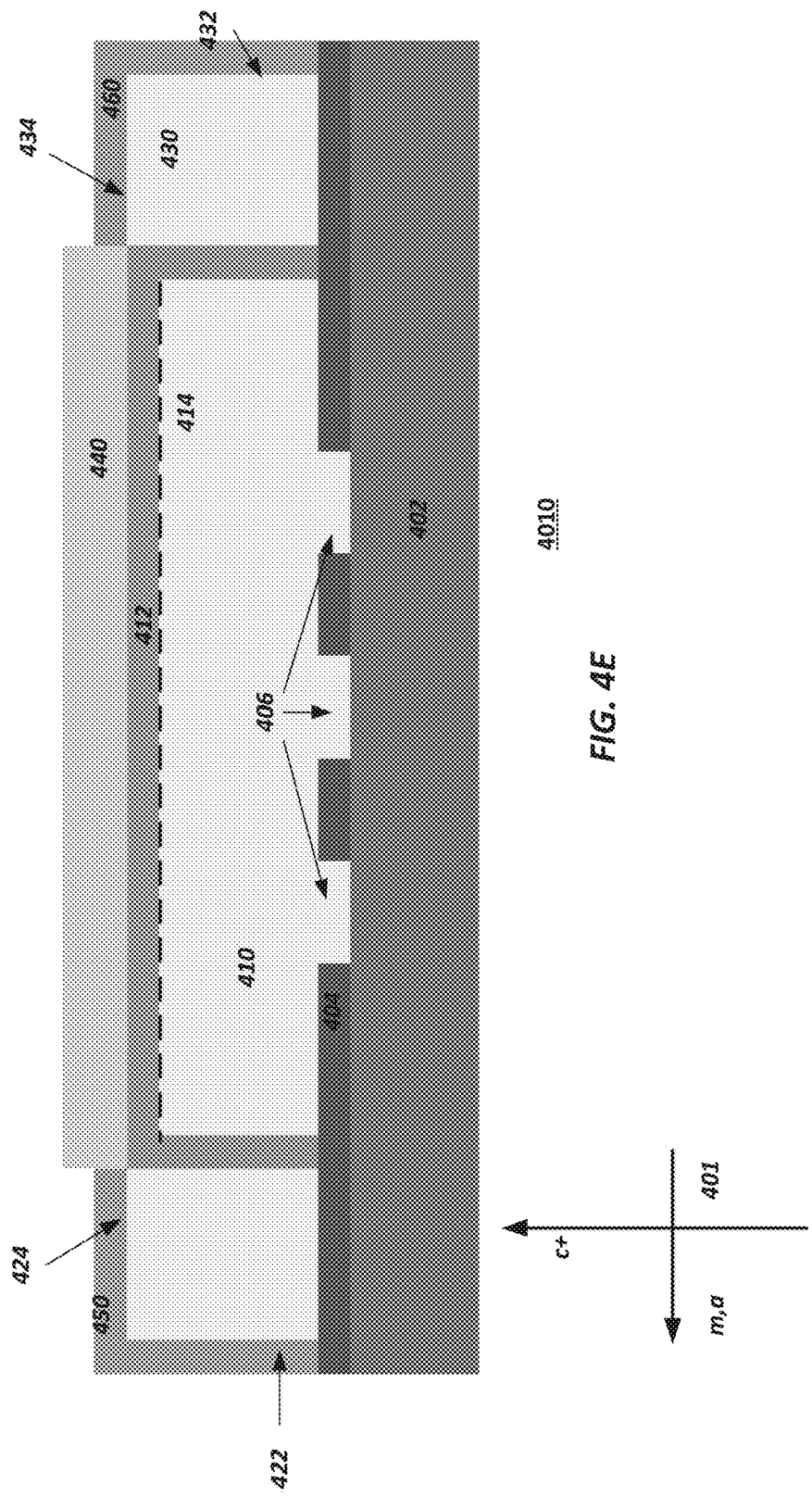

FIG. 4E is a schematic block diagram 4010 for forming PMOS active layers. The active layer 450 can be grown on top 424 of the undoped GaN layer 420 and covering a sidewall 422 of the GaN layer 420. The active layer 460 can be grown on top 434 of the undoped GaN layer 430 and covering a sidewall 432 of the GaN layer 430. The active layers 450 and 460 can include highly doped gallium nitride, such as magnesium doped GaN. The hard mask 440 can then be removed by etching or polishing techniques to make way for the gate materials.

An advantage to this design is the utilization of polarization properties for the NMOS device and use of the non-polar planes of the grown GaN for the p-channel device (PMOS). This design could be alternated using the –c plane for the p channel transistor and the m-planes for the NMOS transistor. The p channel device similar to a MESFET device, where the p doped GaN is used as the channel and the gate is used to deplete the channel and cause the channel to be switched off. The un-doped underlying GaN and the high band gap AlGaN/AlInN at the back of the p channel serves as an insulator for the p channel.

Also, the undoped GaN layer for the PMOS devices is grown from the sidewalk of the polarization layer 412. Hence the "bottom" of the p channel is on an oxide (such as the STI oxide) which provides better and improved short channel effects.

Figure 5:
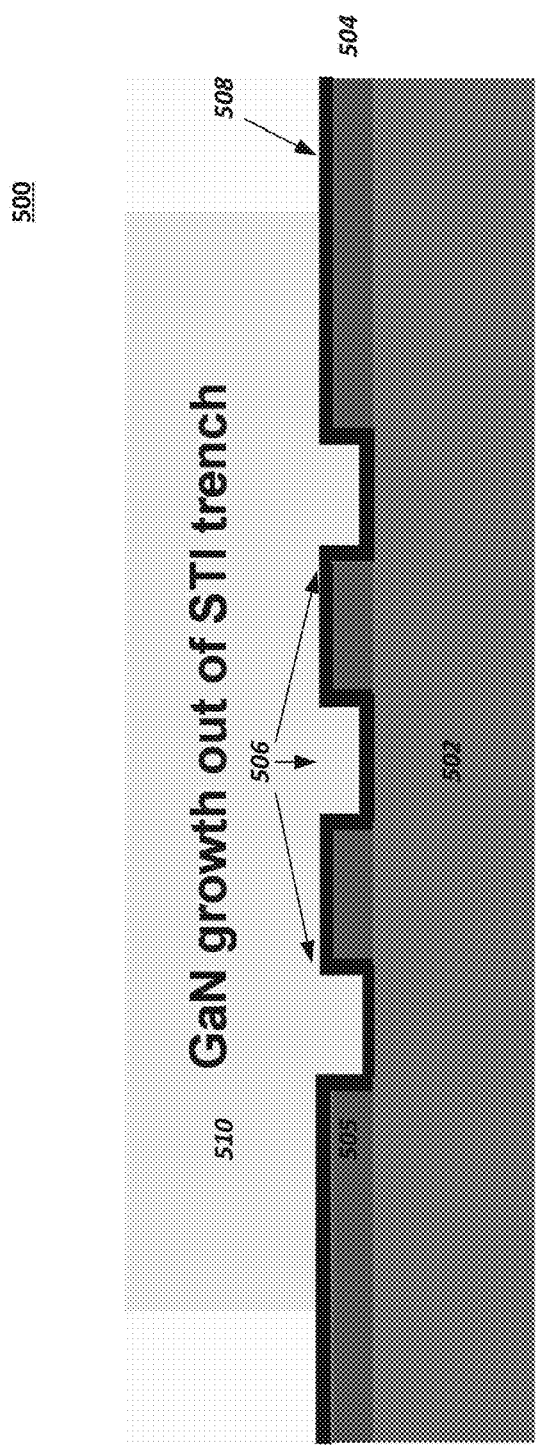
FIG. 5 a schematic block diagram of a gallium nitride based complementary metal oxide semiconductor (CMOS) transistor in accordance with embodiments of the present disclosure.

FIG. 5 a schematic block diagram 500 of a showing the formation of a GaN layer 510 from shallow trench isolation layer 504 and a seed layer 508 in accordance with embodiments of the present disclosure. The diagram 500 can be used instead of FIG. 4B. A shallow trench isolation layer 504 is formed on a silicon substrate 502. A seed layer 508 is formed on the STI oxide 505 and in the STI trenches 506. The seed layer 508 can be aluminum nitride or other aluminum nitride alloy that fosters gallium nitride epitaxial growth. The GaN layer 510 is grown epitaxially from the seed layer 508.

Figure 6:
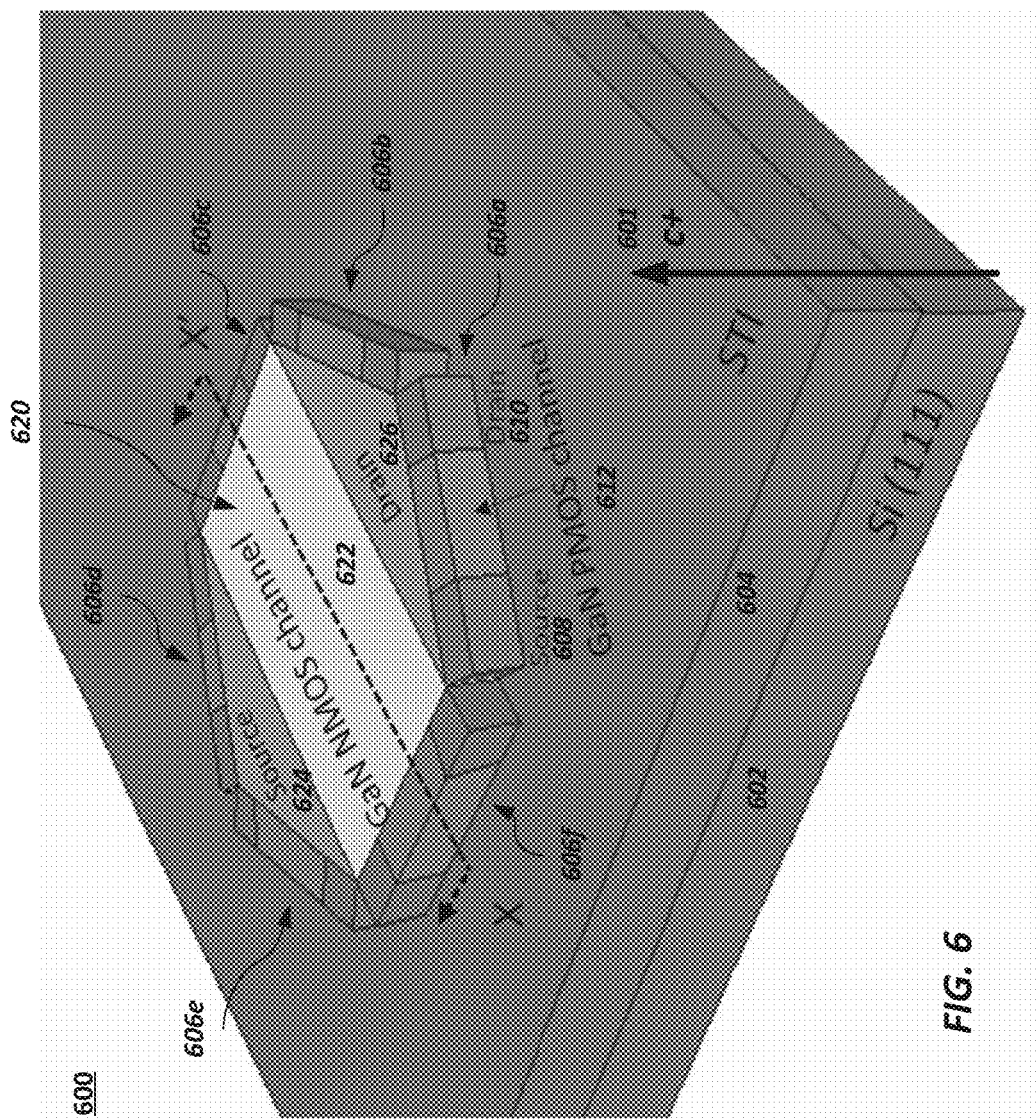
FIG. 6 a schematic block diagram of a gallium nitride based n-type MOS transistor with a plurality of p-type MOS transistors in accordance with embodiments of the present disclosure.

FIG. 6 a schematic block diagram of a gallium nitride based n-type MOS transistor 620 with a plurality of p-type MOS transistors 606a-606f in accordance with embodiments of the present disclosure. A cross section slice through X-X' is the same or similar as that shown in FIG. 2. FIG. 6 shows six PMOS transistors 606a-606f formed around a GaN NMOS transistor 620. The transistors are formed on a silicon 111 substrate. The GaN layer forming the GaN NMOS channel and the GaN PMOS channels is formed epitaxially in the c+ direction (601). The GaN is formed from the shallow trench isolation layer 604. The GaN NMOS channel 622 is adjacent on one side by a source electrode 624 and adjacent on another side by the drain 626. Each of the PMOS transistors includes a source 608 and drain 610 surrounding a PMOS channel 612.

Described herein are systems and methods of co-integrating the. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

It has been experimentally shown that higher levels of GaN p doping is possible for GaN grown on the m plane that the c plane. Hence this structure will enable lower source and drain contact resistances for the p channel transistor. Since the hole mobility in GaN and III-N semiconductor systems are much lower (hole mobility is around 20 cm2/V-s while electron mobility is around 1500 cm2/V-s) than electron mobility, the channel resistances for p-type devices is quite high and hence on current and performance is poorer than the NMOS counterpart. This design gives the flexibility of 2 times width of the p-type devices than the NMOS device to bridge the performance gap between the PMOS and the NMOS, since for every NMOS device there are two PMOS devices on the sidewalls. Also it is possible to have a longer PMOS device in this architecture than the NMOS.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The terms "over," "under," "beneath," "between," "on," and "residing on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature "disposed" between two features may be in direct contact with the adjacent features or may have one or more intervening layers.

Additionally, the terms "beneath," "on," "residing on," and "formed on" and other similar terms may imply a physical connection, an electrical connection, or physical and electrical connection between two material layers.

Similarly, the term "formed on" can include one or more semiconductor processing techniques, such as epitaxial growth, chemical vapor deposition, photolithography techniques, etc. A layer can be formed on another layer or on a substrate, and can imply formation on intervening layers, such as seed layers and incidental materials leftover from previous processing.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 7:
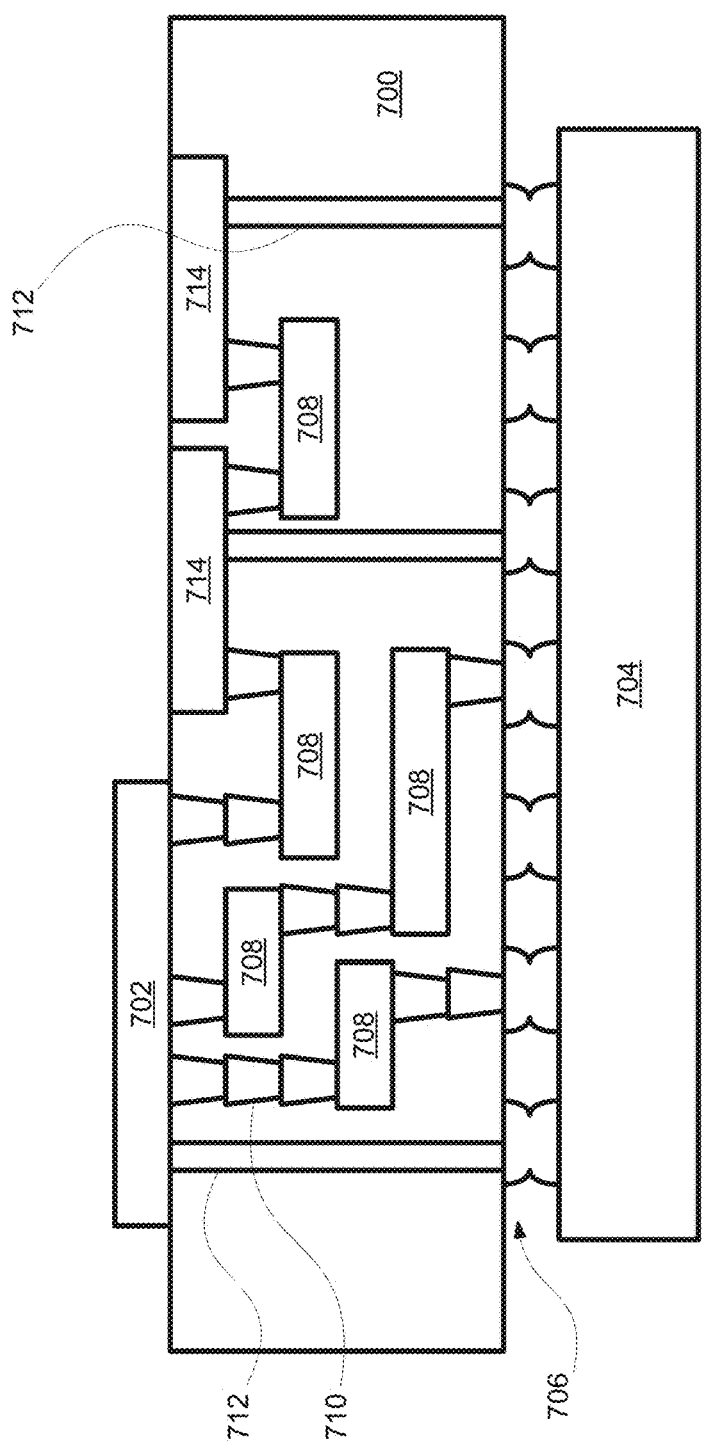
FIG. 7 illustrates an interposer that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the invention, apparatuses or processes disclosed herein may be used in the fabrication of interposer 700.

Figure 8:
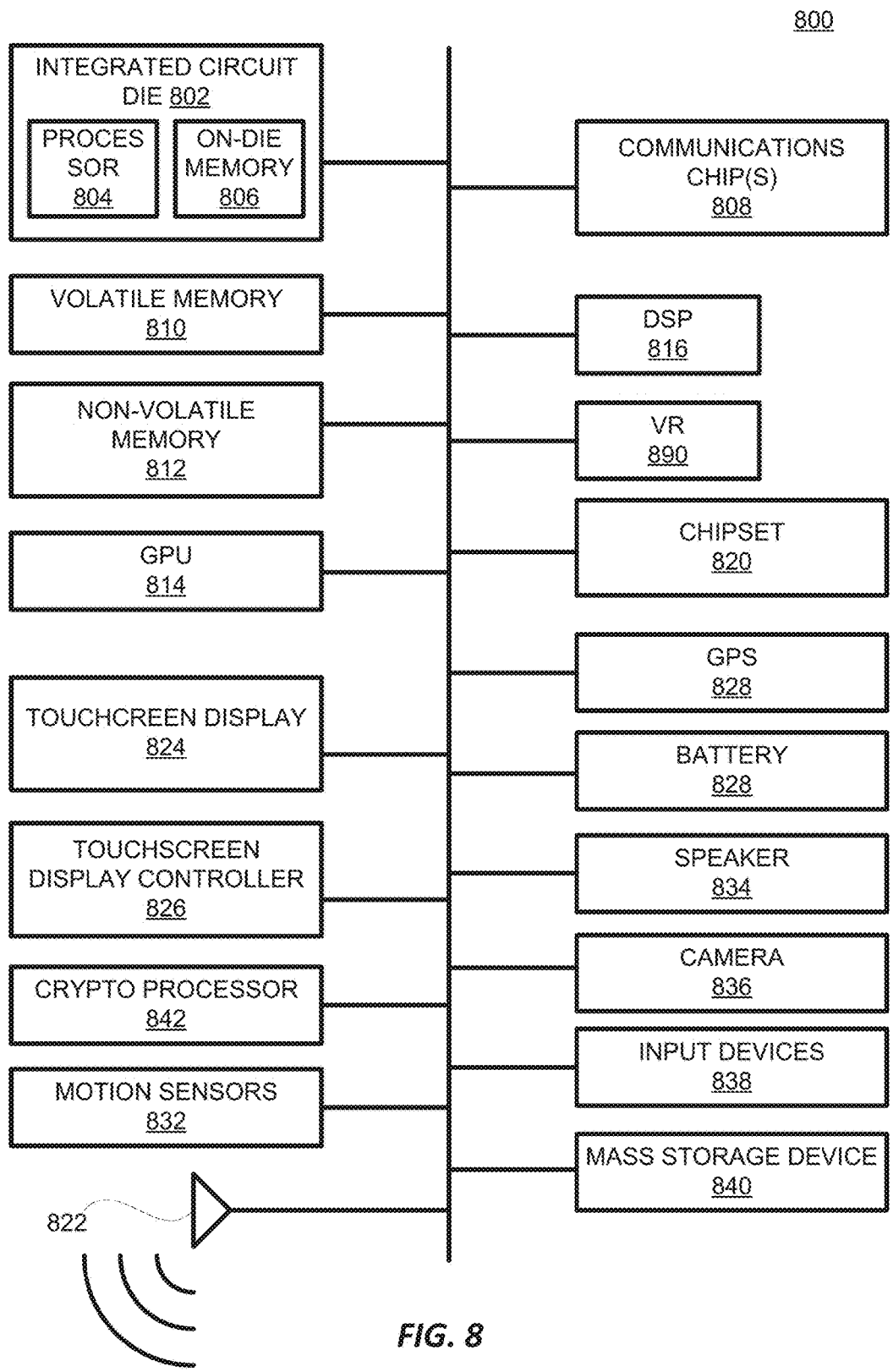
FIG. 8 illustrates a computing device in accordance with one embodiment of the invention.

FIG. 8 illustrates a computing device 800 in accordance with one embodiment of the invention. The computing device 800 may include a number of components. In one embodiment, these components are attached to one or more motherboards. In an alternate embodiment, some or all of these components are fabricated onto a single system-on-a-chip (SoC) die. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STT-MRAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 828 or other power source, a power amplifier (not shown), a voltage regulator (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors or metal interconnects, that are formed in accordance with embodiments of the invention. The term "processor" may refer to any device or portion of a device that processes electronic data from registers and/or memory to transform that electronic data into other electronic data that may be stored in registers and/or memory.

The communications logic unit 808 may also include one or more devices, such as transistors or metal interconnects, that are formed in accordance with embodiments of the invention.

In further embodiments, another component housed within the computing device 800 may contain one or more devices, such as transistors or metal interconnects, that are formed in accordance with implementations of the invention.

In further embodiments, another component housed within the computing device 800 may contain a power management integrated circuit (PMIC). The PMIC can include controller circuitry, power train circuitry, and driver transistor circuitry. The PMIC circuitry can include one or more GaN transistors described herein.

In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

The following paragraphs provide examples of various ones of the embodiments disclosed herein.

Example 1 is a gallium nitride transistor that includes a silicon substrate; a first oxide layer and a second oxide layer on the substrate; a first gallium nitride layer on the silicon substrate and the first oxide layer and the second oxide layer on the substrate; an polarization layer on the first gallium nitride layer; a second gallium nitride layer on the oxide layer on the substrate and adjacent a first sidewall of the polarization layer; a first p-doped gallium nitride layer on the second gallium nitride layer; a third gallium nitride layer on the oxide layer on the substrate and adjacent a second sidewall of the polarization layer; and a second p-doped gallium nitride layer on the third gallium nitride layer.

Example 2 may include the subject matter of example 1, wherein the first gallium nitride layer formed on the silicon substrate and on the oxide layer is formed in the C+ crystalline direction.

Example 3 may include the subject matter of example 1, wherein the polarization layer comprises one of aluminum nitride (AlN), aluminum gallium nitride (AlGaN), or aluminum indium nitride (AlInN).

Example 4 may include the subject matter of example 1, wherein the oxide layer comprises a shallow trench isolation layer formed on the silicon substrate, the shallow trench isolation layer comprising one or more trenches that expose at least a portion of the silicon substrate.

Example 5 may include the subject matter of example 4, wherein the first gallium nitride layer is disposed on the shallow trench isolation layer and the exposed portion of the silicon substrate.

Example 6 may include the subject matter of any of examples 4 or 5, wherein the second gallium nitride layer and the third gallium nitride layer reside on the shallow trench isolation layer.

Example 7 may include the subject matter of example 1, wherein the gallium nitride transistor may also include an n-type metal oxide semiconductor (NMOS) transistor comprising at least the first gallium nitride layer on the silicon substrate and the first and second oxide layers on the substrate, the polarization layer on the first gallium nitride layer, and the two dimensional electron gas disposed at the interference between the first gallium nitride layer and the polarization layer; a first p-type MOS (PMOS) transistor comprising at least the second gallium nitride layer on the oxide layer on the substrate and adjacent a first sidewall of the polarization layer and the first p-doped gallium nitride layer on the second gallium nitride layer form; and a second p-type MOS (PMOS) transistor comprising at least the third gallium nitride layer on the oxide layer on the substrate and adjacent a second sidewall of the polarization layer and the second p-doped gallium nitride layer on the third gallium nitride layer.

Example 8 may include the subject matter of example 1, wherein the silicon substrate may also include silicon 111, silicon 100, or silicon 110.

Example 9 may include the subject matter of example 1, and may also include a gate electrode on the polarization layer.

Example 10 may include the subject matter of example 1, and may also include a first gate electrode on the first p-doped gallium nitride layer on the second gallium nitride layer; and a second gate electrode on the second p-doped gallium nitride layer on the third gallium nitride layer.

Example 11 is a method for forming a gallium nitride on silicon transistor, the method may also include forming a first oxide island and a second oxide island on a silicon substrate, the first and second oxide islands separated by a trench; forming a first gallium nitride layer in the trench and on a portion of the first and second oxide islands; forming an polarization layer on a top side of the first gallium nitride layer and on a first and second side wall of the first gallium nitride layer; forming a second gallium nitride layer on a first portion of the shallow trench isolation layer on a first sidewall of the polarization layer; forming a doped gallium nitride layer on the second gallium nitride layer.

Example 12 may include the subject matter of example 11, and may also include forming a third gallium nitride layer on a second portion of the shallow trench isolation layer adjacent a second sidewall of the polarization layer; and forming a doped gallium nitride layer on the third gallium nitride layer.

Example 13 may include the subject matter of example 11, wherein forming the first gallium nitride layer comprises epitaxially growing the first gallium nitride layer from a seed layer in the trench.

Example 14 may include the subject matter of any of examples 11 or 13, wherein forming the first gallium nitride layer comprises forming the first gallium nitride layer in a direction substantially parallel to an axis parallel to a C crystalline direction axis.

Example 15 may include the subject matter of example 11, wherein forming the polarization layer comprises forming the polarization layer on a top side of the first gallium nitride layer and one a first or second sidewall of the first gallium nitride layer.

Example 16 may include the subject matter of any of examples 11 or 15; wherein forming the polarization layer comprises forming one of an aluminum nitride (AlN) layer, an aluminum gallium nitride (AlGaN) layer, or an aluminum indium nitride (AlInN) layer on the first gallium nitride layer.

Example 17 may include the subject matter of example 11, wherein forming the shallow trench isolation layer may also include forming an oxide layer on the silicon substrate; and etching a trench in the oxide layer to expose the silicon substrate, the trench isolating a portion of the oxide layer.

Example 18 may include the subject matter of example 11, wherein the p-doped gallium nitride layer on the second gallium nitride layer comprises a magnesium dopant.

Example 19 may include the subject matter of example 11, wherein forming the second gallium nitride layer comprises growing a growing an undoped gallium nitride layer with a thickness of a range from 30 to 50 nanometers.

Example 20 may include the subject matter of example 11, wherein the two dimensional electron gas is substantially parallel to a C-plane of the first gallium nitride layer.

Example 21 is a computing device that may include a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device may also include a voltage regulator circuit. The voltage regulator circuit may include controller circuitry; driver circuitry; and power train circuitry. The voltage regulator circuit comprises a gallium nitride transistor, the gallium nitride transistor including a silicon substrate; a first oxide layer and a second oxide layer on the substrate; a first gallium nitride layer on the silicon substrate and the first and second oxide layers; a polarization layer on the first gallium nitride layer; a two dimensional electron gas disposed in the first gallium nitride layer proximate to the polarization layer; a second gallium nitride layer on the oxide layer on the substrate and adjacent a first sidewall of the polarization layer; a first p-doped gallium nitride layer on the second gallium nitride layer; a third gallium nitride layer on the oxide layer on the substrate and adjacent a second sidewall of the polarization layer; and a second p-doped gallium nitride layer on the third gallium nitride layer.

Example 22 may include the subject matter of example 21, wherein the first gallium nitride layer formed on the silicon substrate and on the oxide layer is formed in the C+ crystalline direction.

Example 23 may include the subject matter of example 21, wherein the polarization layer comprises one of aluminum nitride (AlN), aluminum gallium nitride (AlGaN), or aluminum indium nitride (AlInN).

Example 24 may include the subject matter of example 21, wherein the oxide layer comprises a shallow trench isolation layer formed on the silicon substrate, the shallow trench isolation layer comprising one or more trenches that expose at least a portion of the silicon substrate.

Example 25 may include the subject matter of example 24, wherein the first gallium nitride layer is disposed on the shallow trench isolation layer and the exposed portion of the silicon substrate.

Example 26 may include the subject matter of any of examples 24 or 25, wherein the second gallium nitride layer and the third gallium nitride layer reside on the shallow trench isolation layer.

Example 27 may include the subject matter of example 21, wherein the gallium nitride transistor may also include an n-type metal oxide semiconductor (NMOS) transistor comprising at least the first gallium nitride layer on the silicon substrate and the oxide layer, the polarization layer on the first gallium nitride layer, and the two dimensional electron gas disposed in the first gallium nitride layer proximate to the polarization layer; a first p-type MOS (PMOS) transistor comprising at least the second gallium nitride layer on the oxide layer on the substrate and adjacent a first sidewall of the polarization layer and the first p-doped gallium nitride layer on the second gallium nitride layer form; and a second p-type MOS (PMOS) transistor comprising at least the third gallium nitride layer on the oxide layer on the substrate and adjacent a second sidewall of the polarization layer and the second p-doped gallium nitride layer on the third gallium nitride layer.

Example 28 may include the subject matter of example 21, wherein the silicon substrate comprises silicon 111, silicon 100, or silicon 110.

Example 29 may include the subject matter of example 21, and may also include a gate electrode on the polarization layer.

Example 30 may include the subject matter of example 21, and may also include a first gate electrode on the first p-doped gallium nitride layer on the second gallium nitride layer; and a second gate electrode on the second p-doped gallium nitride layer on the third gallium nitride layer.

Example 31 may include the subject matter of example 1, wherein the second gallium nitride layer comprises an undoped gallium nitride layer comprising a thickness of a range from 30 to 50 nanometers.

Example 32 may include the subject matter of example 11, and also include a two dimensional electron gas disposed at an interface between the first gallium nitride layer and the polarization.

Example 33 may include the subject matter of example 21, wherein the polarization layer and the first gallium nitride layer form a two dimensional electron gas at an interface between the first gallium nitride layer and the polarization layer.

Example The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A gallium nitride transistor comprising:
    a substrate;
    a first dielectric material and a second dielectric material on the substrate, each of the first and second dielectric materials including oxygen;
    a first gallium nitride layer on the substrate and on the first and second dielectric materials;
    a polarization layer on the first gallium nitride layer;
    a second gallium nitride layer on the first dielectric material and adjacent a first sidewall of the polarization layer;
    a first doped gallium nitride layer on the second gallium nitride layer;
    a third gallium nitride layer on the second dielectric material and adjacent a second sidewall of the polarization layer; and
    a second doped gallium nitride layer on the third gallium nitride layer.

2. The gallium nitride transistor of claim 1, wherein the first gallium nitride layer is in the C+ crystalline direction.

3. The gallium nitride transistor of claim 1, wherein the polarization layer comprises one of aluminum nitride (AlN), aluminum gallium nitride (AlGaN), or aluminum indium nitride (AlInN).

4. The gallium nitride transistor of claim 1, wherein the gallium nitride transistor comprises:
    an n-type metal oxide semiconductor (NMOS) transistor comprising at least the first gallium nitride layer on the substrate and the first dielectric material, the polarization layer on the first gallium nitride layer;
    a first p-type MOS (PMOS) transistor comprising at least the second gallium nitride layer on the first dielectric material on the substrate and adjacent a first sidewall of the polarization layer and the first doped gallium nitride layer on the second gallium nitride layer form; and
    a second p-type MOS (PMOS) transistor comprising at least the third gallium nitride layer on the second dielectric material on the substrate and adjacent a second sidewall of the polarization layer and the second doped gallium nitride layer on the third gallium nitride layer.

5. The gallium nitride transistor of claim 4, wherein a two dimensional electron gas is at the interface between the first gallium nitride layer and the polarization layer.

6. The gallium nitride transistor of claim 1, further comprising a two dimensional electron gas at an interface between the first gallium nitride layer and the polarization layer.

7. The gallium nitride transistor of claim 1, wherein the second gallium nitride layer comprises an undoped gallium nitride layer having a thickness between 30 and 50 nanometers.

8. The gallium nitride transistor of claim 1, wherein the substrate comprises silicon 111, silicon 100, or silicon 110.

9. The gallium nitride transistor of claim 1, further comprising a gate electrode on the polarization layer.

10. The gallium nitride transistor of claim 1, further comprising:
a first gate electrode on the first doped gallium nitride layer on the second gallium nitride layer; and
a second gate electrode on the second doped gallium nitride layer on the third gallium nitride layer.

11. A method for forming a gallium nitride complementary metal-oxide-semiconductor device, the method comprising:
forming a first oxide island and a second oxide island on a substrate, the first and second oxide islands separated by a trench;
forming a first gallium nitride layer in the trench and on a portion of the first and second oxide islands;
forming a polarization layer on a top side of the first gallium nitride layer and on a first and second side wall of the first gallium nitride layer;
forming a second gallium nitride layer on the first oxide island and on a first sidewall of the polarization layer;
forming a doped gallium nitride layer on the second gallium nitride layer.

12. The method of claim 11, further comprising:
forming a third gallium nitride layer on the second oxide island and on a second sidewall of the polarization layer; and
forming a doped gallium nitride layer on the third gallium nitride layer.

13. The method of claim 11, wherein forming the first gallium nitride layer comprises epitaxially growing the first gallium nitride layer from a seed layer in the trench.

14. The method of claim 11, wherein forming the first gallium nitride layer comprises forming the first gallium nitride layer in a direction substantially parallel to a C crystalline axis.

15. The method of claim 11, wherein forming the polarization layer comprises forming the polarization layer on a top side of the first gallium nitride layer and one a first or second sidewall of the first gallium nitride layer.

16. The method of claim 11, wherein forming the polarization layer comprises forming one of an aluminum nitride (AlN) layer, an aluminum gallium nitride (AlGaN) layer, or an aluminum indium nitride (AlInN) layer on the first gallium nitride layer.

17. The method of claim 11, wherein forming the first and second oxide islands comprises:
forming an oxide layer on the substrate;
etching a trench in the oxide layer to expose the substrate, the trench isolating a portion of the oxide layer.

18. The method of claim 11, wherein the doped gallium nitride layer on the second gallium nitride layer comprises a magnesium dopant.

19. The method of claim 11, wherein forming the second gallium nitride layer comprises growing an undoped gallium nitride layer with a thickness between 30 and 50 nanometers.

20. The method of claim 11, wherein the two dimensional electron gas is substantially parallel to a c-plane of the first gallium nitride layer.

21. A computing device, comprising:
a voltage regulator circuit, the voltage regulator circuit comprising
a gallium nitride transistor, the gallium nitride transistor comprising:
a substrate,
a first dielectric material and a second dielectric material on the substrate, each of the first and second dielectric materials including oxygen
a first gallium nitride layer on the substrate and the first dielectric material and on the second dielectric material,
a polarization layer on the first gallium nitride layer,
a second gallium nitride layer on the first dielectric material on the substrate and adjacent a first sidewall of the polarization layer,
a first doped gallium nitride layer on the second gallium nitride layer;
a third gallium nitride layer on the second dielectric material on the substrate and adjacent a second sidewall of the polarization layer, and
a second doped gallium nitride layer on the third gallium nitride layer.

22. The computing device of claim 21, wherein the first gallium nitride layer is in the C+ crystalline direction.

23. The computing device of claim 21, wherein the gallium nitride transistor comprises:
an n-type metal oxide semiconductor (NMOS) transistor comprising at least the first gallium nitride layer on the substrate and the first and second dielectric materials, the polarization layer on the first gallium nitride layer;
a first p-type MOS (PMOS) transistor comprising at least the second gallium nitride layer on the first dielectric material on the substrate and adjacent a first sidewall of the polarization layer and the first doped gallium nitride layer on the second gallium nitride layer form; and
a second p-type MOS (PMOS) transistor comprising at least the third gallium nitride layer on the second dielectric material on the substrate and adjacent a second sidewall of the polarization layer and the second doped gallium nitride layer on the third gallium nitride layer.

24. The computing device of claim 21, further comprising a gate electrode on the polarization layer.

25. The computing device of claim 21, further comprising:
a first gate electrode on the first doped gallium nitride layer on the second gallium nitride layer; and
a second gate electrode on the second doped gallium nitride layer on the third gallium nitride layer.

* * * * *